United States Patent [19]

Pribat et al.

[11] Patent Number: 5,314,569
[45] Date of Patent: May 24, 1994

[54] METHOD FOR THE CONTROLLED GROWTH OF CRYSTAL WHISKERS AND APPLICATION THEREOF TO THE MAKING OF TIP MICROCATHODES

[75] Inventors: Didier Pribat, Sevres; Pierre Leclerc, Voisins-Le-Bretonneux; Pierre Legagneux, Le Mesnil St Denis; Christian Collet, Limours, all of France

[73] Assignee: Thomson-CSF, Puteaux, France

[21] Appl. No.: 995,533

[22] Filed: Dec. 22, 1992

Related U.S. Application Data

[63] Continuation of Ser. No. 645,241, Jan. 24, 1991, abandoned.

[30] Foreign Application Priority Data

Feb. 23, 1990 [FR] France ............... 90 02258

[51] Int. Cl.$^5$ ............................................. C03B 25/04
[52] U.S. Cl. ................................. 117/75; 117/931; 117/939
[58] Field of Search ............. 156/609, 610, 611, 612, 156/DIG. 101, DIG. 111, DIG. 112

[56] References Cited

U.S. PATENT DOCUMENTS

| | | | |
|---|---|---|---|
| 3,493,431 | 2/1970 | Wagner | 156/609 |
| 3,549,432 | 12/1970 | Sivertson | 156/611 |
| 3,580,732 | 5/1971 | Blakeslee et al. | 156/609 |
| 3,721,732 | 3/1973 | Knippenberg et al. | 156/609 |
| 4,058,418 | 11/1977 | Lindmayer | 156/611 |
| 4,155,781 | 5/1979 | Diepers | 156/609 |
| 4,549,926 | 10/1985 | Corbay, Jr. et al. | 156/DIG. 111 |

FOREIGN PATENT DOCUMENTS 0278405 8/1988 European Pat. Off. .
WO8909479 10/1989 PCT Int'l Appl. .

OTHER PUBLICATIONS

Applied Physics Letters, vol. 4, No. 5, Mar. 1964, pp. 89–90, R. S. Wagner, et al., "Vapor-Liquid-Solid Mechanism of Single Crystal Growth".
IBM Technical Disclosure Bulletin, vol. 19, No. 10, Mar. 1977, one page, W. A. Thompson, "Preparing High Emission Cathodes".

*Primary Examiner*—Olik Chaudhuri
*Assistant Examiner*—Felisa Garrett
*Attorney, Agent, or Firm*—Oblon, Spivak, McClelland, Maier & Neustadt

[57] ABSTRACT

A method of growth according to which a layer of a material having apertures is made on the surface of a substrate. A material is deposited in each aperture. When this material is liquid, it can absorb the material to be grown. Then, the growth is done in vapor phase. The material of the layer is chosen in such a way that there is neither growth nor nucleation on its surface during the growth in vapor phase. The disclosed method can be applied to the making of crystal whiskers positioned with precision, and to the making of tip type microcathodes.

20 Claims, 6 Drawing Sheets

FIG_3

FIG_2-a

FIG_2-b

FIG_2-c

FIG_2-d

FIG_2-e

FIG_2-f

FIG_2-g

FIG_4-a

FIG_4-b

FIG_4-c

FIG_4-d

FIG_4-e

FIG_5

FIG_6-a

FIG_6-b

FIG_6-c

FIG_6-d

FIG_7-a

FIG_7-b

FIG_7-c

FIG_7-d

FIG_8

FIG_9

METHOD FOR THE CONTROLLED GROWTH OF CRYSTAL WHISKERS AND APPLICATION THEREOF TO THE MAKING OF TIP MICROCATHODES

This application is a continuation of application Ser. No. 07/645,241, filed on Jan. 24, 1991, now abandoned.

BACKGROUND OF THE INVENTION

1. Field of the Invention

The invention relates to a method for the controlled growth of crystal whiskers and its application to the making of tip type microcathodes. More particularly, the invention relates to the field of the controlled growth of filamentary monocrystals or whiskers. By means of a known method (the VLS or vapor-liquid-solid method) developed in the sixties, it makes it possible to obtain regular matrices of whiskers with controlled height and diameter.

One of the possible applications is the making of matrices of microtips for field-effect cathodes.

2. Description of the Prior Art

Whiskers are filamentary monocrystals having a length/diameter ratio of more than 10. They have been known for a very long time, but interest in this type of crystals was stimulated at the beginning of the fifties when Herring and Gatt, in the *Physical Review* 85, (1952), 1060, showed that these crystals have mechanical properties similar to those of monocrystals.

E. I. Givargizov has also provided a complete description of this subject in E. Kaldis ed., *Current Topics in Materials Science,* Volume 1, North Holland, 1978, p. 79.

Two mechanisms have been put forward to explain filamentary growth in largely anisotropic vapor phase. These are, firstly, a mechanism that postulates the existence of a helicoidal dislocation at the center of the crystal, said dislocation behaving like an unsaturable atomic process (growth of the crystal helicoidally around the axis of the dislocation) and, secondly, a mechanism based on the VLS method wherein there is provision for a liquid phase at the top of the whisker as an essential source of anisotropy.

Figure 1:
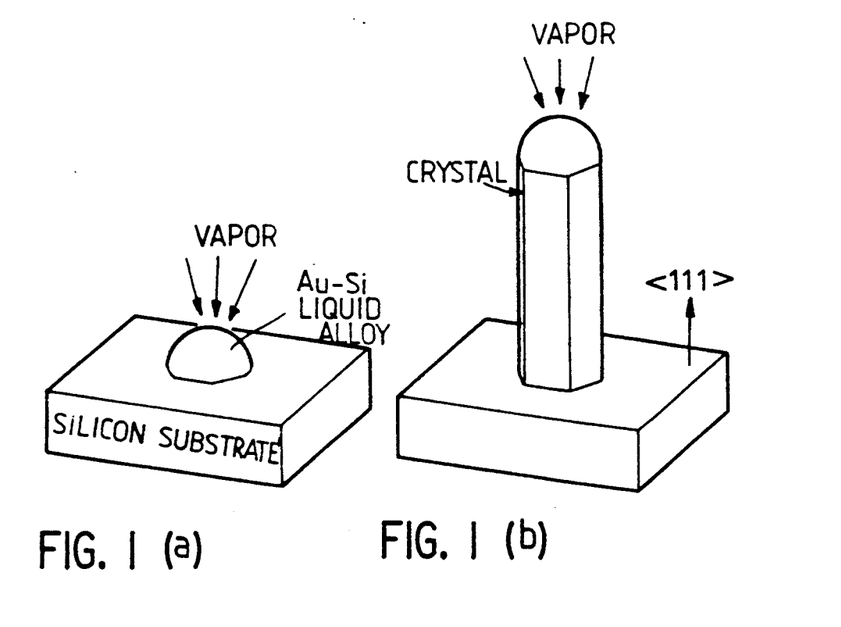
- FIGS. 1a and 1b show a known technique of growth already described here above.

The principle of the VLS method is shown in FIGS. 1a and 1b for a silicon substrate (111). A layer of liquid, in which Si is soluble, is interposed between the vapor phase and the solid. Since the surface of liquid has a very large number of adsorption sites (each surface atom of the liquid is potentially an adsorption site) that are unsaturable (since there is immediate dissolving of the adsorbate and renewal of the site), this surface of liquid becomes a favored place of deposition which is at the origin of the anisotropy of growth.

The dissolved adsorbate prompts an over-saturation of the liquid which then expels solid matter to the liquid/solid interface, so as to return to equilibrium. The drop of liquid rises little by little on the expelled crystal which takes the form of a whisker with a diameter equal to that of the drop of liquid.

FIGS. 1a and 1b represent the VLS principle applied to the silicon but, quite clearly, it is possible to use a whole variety of different substrates associated with drops of liquid that are also highly varied (see for example Givargizov, already cited).

According to the known techniques, filamentary monocrystals or whiskers can therefore be made to grow on a substrate. However, this growth is not controlled and the points of growth are located randomly and unevenly on the surface of the substrate.

The present invention relates to a method for the controlled growth of whiskers using the VLS method. In controlling this growth, the invention therefore enables the making of whiskers at chosen points of the surface of the substrate and the making of matrices of filaments for example.

SUMMARY OF THE INVENTION

The invention relates to a method for the controlled growth of crystal whiskers comprising the following steps:
- a first step for the making, on a substrate, of a first layer of a material on which there can be neither growth nor nucleation of the material to be grown in the subsequent steps;
- a second step for the making, in said first layer, of at least one aperture;
- a third step for the selective deposition, in said aperture, of at least one material which, once it is liquid, is capable of dissolving and of absorbing the material to be grown;
- a fourth step for the heating and growth in vapor phase, in said aperture, of the material to be grown in the form of a whisker.

The invention also relates to a method for making a tip microcathode that applies the above method wherein, before the second step of manufacture, it includes a stage for making a third layer of an electrically conductive material followed by another stage for making a fourth layer of a dielectric material.

BRIEF DESCRIPTION OF THE DRAWINGS

The different objects and features of the invention will appear more clearly in the following description and in the appended drawings, of which:
- FIGS. 2a to 2g show a method for the growth of monocrystals according to the invention;
- FIG. 3 shows a tip electrode obtained by the method of the invention;
- FIG. 4a to 4c shows a method for making a microtip cathode according to the invention;
- FIG. 5 shows a detailed view of a tip electrode obtained by the method of FIGS. 4a to 4e;
- FIGS. 6a to 6d show a variant of the manufacturing method according to the invention;
- FIGS. 7a and 7d show another variant of the manufacturing method according to the invention;
- FIG. 8 shows the general shape of a microtip formed by the method of the invention described above;
and
- FIG. 9 shows a variation of the shape of the microtip, wherein the tip growth is excellerated at a faster tapering to form a more narrow apex portion.

DETAILED DESCRIPTION OF THE INVENTION

Referring to FIGS. 2a and 2g, we shall firstly describe the basic method according to the invention.

As shown in FIG. 2a, a substrate made of Si, for example, or of GaAs with a preferred orientation (111) is used. A layer 1 of $SiO_2$ is deposited (or obtained by oxidation)on this substrate. The thickness of this layer 1 typically ranges from 0.1 micrometer to some micrometers.

Then, a layer of photosensitive resin (or a metallic surface mask) is deposited. This layer or mask is exposed an developed (optically or by means of an electron beam) so that substantially circular apertures 5, with a diameter of 0.1 to 2 μm, and with a spacing of 0.5 μm to some μm, are made. Thus, a structure such as the one shown in FIG. 2b is obtained.

Then RIE (reactive ion etching) is used to etch (FIG. 2c) the underlying silica in using the resin mask (or metal mask) as the case may be.

Then, by evaporation, a layer of metal such as gold (or else Ag, Cu, Pt, Pd, Ni, Gd, Mg, Os, ...) is deposited (FIG. 2d). This layer ha a thickness of 1 nm to 500 nm, adapted to the diameter of the apertures in $SiO_2$ (the smaller the diameter of the apertures, the smaller too will be the thickness of the metal layer).

Then, as shown in FIG. 2e, the resin or the metal mask is dissolved (in the case of a metal mask, an electrochemical dissolving will be carried out) so as to get rid of the resin and the Au deposit located on the above-mentioned resin.

The set of steps shown in FIGS. 2d and 2e constitutes a standard lift-off operation. At this stage of the method, precisely localized metal tips (made of gold for example) have been obtained For example, a matrix of gold tips has been obtained.

In the next step, a semiconductor material is grown on the metal tips that were earlier deposited selectively: to this end, and still taking the example of silicon, the substrate thus obtained is introduced into a reactor for CVD deposition under an atmosphere of $SiH_4+HCl$ or $SiH_2Cl+HCl$ or $SiCl_4$ or, again, $SiHCl_3+HCl$ (still using $H_2$ as a carrier gas) and the temperature is taken typically to between 400° C. and 1000° C. Under these conditions, the formation of a liquid phase (AuSi, AuP, AuCu ...), which may or may not be of a eutectic type, is obtained in each $SiO_2$ microcavity.

As explained here above, there is a favored adsorption of the molecules of the gas phase on the droplets of liquid, and this induces an anisotropy of local growth.

Typically, we use a gas mixture formed by $SiH_4$ and HCl in order to obtain a selectivity of deposition and to prevent the nucleation of the silicon as described, for example, in the following documents:

- J. O. Borland, C. I. Drowley, *Solid State Technology*, August 1985, p. 141
- L. Karapiperis et al, *Proceedings of the 18th.Int. Conf. on Solid State Devices and Materials*, Tokyo, 1986, P. 713.

In this way, we are sure that there will be no deposit except at the liquid droplets enabling the growth of the whiskers (FIG. 2f). FIG. 2g shows a growth such as this in greater detail.

Thus two-dimensional regular networks of whiskers are obtained.

In particular, if the deposits of metal have been made in the form of a matrix, it is possible to obtain a matrix of whiskers.

One possible application lies in the making of networks of field effect microcathodes. The following are the typical dimensions of a microcathode such as thus:
- dimensions at the base = 1.5 μm,
- height = 1.5 μm, A microcathode such as this has the following electrical characteristics:
  field emission for $E = 30 \times 10^6$ V/cm approximately,
  grid voltage = $50V < V_G < 300V$
  tip current = $0.1 \mu A < 1p < 100 \mu A$
  density of tips = $10^6/cm^2$ Referring to FIGS. 4a to 4e, we shall now describe a method for making tip microcathodes using the above method of growth. The following method enables the self-aligned manufacture of networks of microcathodes based on whiskers.

The method starts with a composite structure shown in FIG. 4a and formed by a Si-based substrate (111) typically covered with the following layers:
- layer 1 of $SiO_2$ or grid dielectric (thickness of 1 to 10 μm);
- metal (or degenerated polycrystalline silicon) grid layer 2, with a thickness of 0.1 to 1 μm (G),
- passivation layer 3.

The grid is passivated by means of a very thin layer 3 of $SiO_2$ or $Si_3N_4$, so as to prevent nucleation on this layer during the subsequent operation of deposition. A layer 4 of resin is deposited on the entire unit.

After exposure and development of the resin, RIE is used, as shown in FIG. 4b, to etch apertures such as 5 in the previously obtained composite structure. This apertures are typically circular and have a diameter of 0.1 to 2 micrometers for example.

The spacing of these apertures may be from 0.5 micrometers to some micrometers.

Then (as shown in FIG. 4c) an operation for metal deposition (deposition of gold for example) is done on the entire structure, and then a lift-off operation is performed (FIG. 4d) so as to remove the layer 4 of resin and the metal which is on this layer.

Then (as shown in FIG. 4e) whiskers such as 6 are grown out of molten metallized zones (such as the zone 5) in the same way as described here above.

If the temperature is made to vary during the deposition step, it is possible to obtain a variation in the diameter of the whiskers. Thus the reduction in the temperature leads to a reduction in this diameter.

This decrease in the diameter may enable very sharp-pointed microtips to be obtained quite simply by a controlled oxidation treatment after deposition. Indeed, since oxidation is an isotropic process, the silicon will be gradually converted into $SiO_2$ from the top end of the whiskers onwards, and the $Si/SiO_2$ interface will necessarily retain the shape of a tip. It will be enough then to remove the silica formed by oxidation to bare the Si microtips.

During the deposition step, it is also possible to carry out a doping of the whiskers by the addition, to the $SiH_4+HCl$ mixture, of arsine ($AsH_3$), phosphine ($PH_3$) for an n type doping or else boroethane ($B_2H_6$) for a p type doping.

It is thus possible to make n-p junctions during the growth.

In the foregoing, we have considered the formation of Me-Si alloys where Me is a metal having very little solubility (solubility of the order of $10^{15}$ to $10^{15}$ at/$cm^3$ in silicon or in GaAs and, generally, in the constituent material of the substrate).

It is possible, however, to use an alloy (for example Sb-Si, As-Si, Ga-Si, Al-Si...) in which the metal or the semi-metal (Al, Ga, As, Sb) deposited in the zones of growth of the whiskers and constituting the alloy is highly soluble in silicon (or in GaAs or in the substrate) with a solubility that is typically greater than $10^{19}$ at/$cm^3$ (for As, for example, the maximum solubility at 1000° C. in Si is $1.8 \cdot 10^{21}/cm^3$).

Under these conditions, as and when the whiskers grow, there will be an appreciable decrease in the size of the droplet. This reduction in size is due to a significant incorporation, in the growing whisker, of the alloy element of Si. This will be expressed by a correlative reduction in the diameter of the drop of alloy, and the whiskers will thus naturally have the shape of microtips. The process of growth will end by itself when the entire alloy element has been incorporated into each whisker.

As a non-restrictive example, if a matrix of microcathodes based on Si whiskers with a length of 5 μm is to be made to grow, then a thickness of about 0.03 μm of gallium will be deposited in the $SiO_2$ cavities (FIGS. 4c and 4d). The atomic densities of Si and Ga are close to each other and are of the order of $5.10^{22}$ at/$cm^3$ and the maximum solubility, at 1000° C., of Ga in Si is of the order of $3.10^{19}/cm^3$). In this case, the growth will stop by itself when the entire alloy element has been used up (in this case Ga), i.e. in view of the above-mentioned solubility of Ga in Si, when the whiskers have reached a height of 5 μm.

Another example concerns the use of a GaAs substrate. In this case, gallium will be placed in the microcavities, and the operation will be carried out under a flux of $AsH_3$ or $As_2$ or $As_4$. Subsequently, a growth of GaAs will be obtained. This growth will stop of its own accord when the gallium of the drop has been incorporated into the crystal.

These different examples are not restrictive and are used simply to illustrate the principle of the gradual incorporation of one of the alloy elements forming the liquid microdrop, which correlatively leads to the self-shaping of the microtips.

FIG. 5 summarizes this principle by showing the morphology of the droplet and of the underlying crystal at different times $t_i,(t_i+1>t_i)$. As and when the time increases, the size of the droplet is decreased. This leads to a shaping of the microtip. Different geometrical parameters are specified in FIG. 5 by way of an indication.

The method has been explained with reference to binary alloys. It is quite clear that ternary alloys (AsGaSi for example) or quaternary alloys could have been used.

Another method of forming localized microdrops may also be put into practice by the use of an initial substrate of GaAs on which there is deposited, firstly, a layer 16 of $SiO_2$ or $Si_3N_4$ (FIG. 6a) with a typical thickness of 0.1 to 10 μm. Microcavities 5 (FIG. 6b) are etched in this dielectric layer just as in the previous step. Then, the GaAs substrate is heated in a controlled manner (in a sealed chamber that is scavenged or cleared out). This has the effect of causing the evaporation of the arsenic and, hence, of causing the appearance of localized droplets of Ga at the position where the favored evaporation takes place, i.e. in the microcavities 5. There is therefore a self-alignment of the droplets with the dielectric cavities (FIG. 6c). Then a GaCl+$As_4$ type gas mixture of growth obtained, for example, in a VPE reactor by the arsenic trichloride ($AsCl_3$) method, or else a mixture such as $AsH_3$+TMG (trimethyl gallium) or TEG (triethyl gallium) is made to enter in such a way as to obtain the growth of GaAs whiskers (FIG. 6d). It goes without saying that it is possible to obtain whiskers formed by the stacking of GaAs, GaAlAs etc., by using appropriate generating gases.

FIGS. 7a to 7d represent a variant of this method.

According to this method, given as an example, a layer 7 of GaAs is deposited on a silicon substrate.

The layer 7 is then covered with a layer 16 of $SiO_2$ or $Si_3N_4$ (FIG. 7a).

As earlier, apertures 5 are made in the layer 16 (FIG. 7b).

Then, the entire unit is heated to a temperature such that there is an evaporation of the arsenic of the layer of GaAs which is bared in the apertures 5. A drop of gallium (FIG. 7c) therefore remains in each aperture 5. Then, as shown in FIG. 7d, a growth of whiskers is achieved by means of a gas such as $SiH_4$ for Si whiskers or the above-mentioned gases (GaCl+$As_2$ or TMG, TEG+$AsH_3$ to obtain a growth of GaAs whiskers).

It is quite clear that, in this method, the substrate could be a semiconductor material other than silicon. What is important in this method is that, to create the drop of material enabling the growth of a whisker, a layer 7 of a material is made, and this material, by evaporation, gives a constituent liquid in each aperture 5, this constituent liquid being capable of absorbing the constituent or constituents (in the form of gas precursors) of material that is to be grown in the form of whiskers.

The forming of the shape of the microtips can be done by other techniques.

In particular, according to the invention, an element of the alloy of the drop of liquid may be designed to be slightly volatile when being heated. For example, should arsenic be present in this alloy, this arsenic will be stabilized by the addition of $AsH_3$ to the gas flux during the growth.

The reduction of the $AsH_3$ flux will enable an evaporation of the arsenic of the drop of liquid and this evaporation, by reducing the volume, will lead to a reduction in the section of the corresponding filament.

In the gas fluxes, it is also possible to provide for a corrosive gas that enables the corrosion of at least one of the elements of the liquid alloy. For example, in the case of a drop containing gallium, there will be provision for a gas HCl mixed with the growth gases which, with the gallium, will give GaCl. Depending in the quantity of HCl, there will be a corresponding reduction in the size of the drop.

While the method described further above, in relation with FIGS. 1 to 7d, makes it possible to obtain microtips with the general shape shown in FIG. 8, the methods of variation of a drop of liquid, such as the one providing for a volatile element in the drop of liquid or the one providing for a corrosive gas in the gas flux, make it possible to obtain a microtip of the type shown, for example, in FIG. 9. In this FIG. 9, it is seen that, during the growth of the height h of the microtip, the size of the liquid drop has been speedily reduced.

It follows, from the foregoing, that:

- the invention relates to a method for the easy and reproducible localization of the position of drops of liquid impurities;

- the invention relates to a method for the generation of drops "on site".

- the invention relates to a method for the formation of whiskers with decreasing diameter.

What is claimed is:

1. A method for controlled growth of crystal whiskers, comprising the following steps:
 a first step of forming on a substrate a first layer of a first material on which neither growth nor nucleation of a material to be grown occurs;
 a second step of forming at least one aperture in said first layer;
 a third step of selectively depositing, in said at least one aperture, a second material which, in liquid form, is capable of dissolving and absorbing said material to be grown;

a fourth step of heating and growing in vapor phase, in said at least one aperture, said material to be grown in the form of said crystal whisker; and decreasing a temperature of the whisker during the fourth step of growth in such a way as to achieve a decrease of an upper width of the whisker relative to a lower width of the whisker in order to form a narrow whisker tip.

2. A method according to claim 1, wherein the second step of forming said at least one aperture comprising depositing a mask and etching the first material of said first layer through the mask.

3. A method according to claim 2, wherein the third step of selectively depositing comprises evaporating said second material followed by lifting off the mask and material deposited on a surface of the mask.

4. A method according to claim 1, wherein the first step of forming the first layer is preceded by depositing a second layer of a material containing a constituent in which the substrate can get dissolved, and wherein the third step of of selectively depositing includes evaporating, enabling only said constituent to be kept in the aperture.

5. A method according to claim 1, wherein the substrate is silicon and the material deposited during the third step is a metal selected from the group consisting of Au, Cu, Pt, Pd, Ni, Gd, Mg, and wherein the fourth step further comprises using a gas of $SiH_4$ and $HCl$ or $SiH_2Cl_2$ and $HCl$ or $SiCl$.

6. A method according to claim 1, wherein the substrate comprises GaAs and the fourth step further comprises using a gas selected from the group consisting of GaCl and $As_4$, TMG and $AsH_3$, and TEG and $AsH_3$.

7. A method according to claim 6, wherein the third step comprises evaporating through the aperture, a portion of the substrate, so as to form a drop of gallium in the aperture.

8. A method according to claim 1, comprising using a corrosive gas to corrode at least one constituent of the material deposited during the third step, a quantity of this corrosive gas being controlled so as to control the corrosion of this constituent.

9. A method according to claim 8 further comprising the step of forming a third layer of an electrically conductive material followed by forming a fourth layer of a dielectric material, prior to said step of forming at least one aperture in said first layer.

10. A method for controlled growth of crystal whiskers, comprising the following steps:
a first step of forming on a substrate a first layer of a first material on which neither growth nor nucleation of a second material to be grown occurs;
a second step of forming at least one aperture in said first layer;
a third step of selectively forming, in said at least one aperture, a third material which, in liquid form, is capable of dissolving and absorbing said second material
a fourth step of heating said third material and growing in vapor phase, in said at least one aperture, said second material in the form of said crystal whisker; and
wherein the third material comprises a constituent that is volatile at a temperature of growth of the fourth step, and wherein the growth of the fourth step is achieved in the presence of a gas comprising said constituent that is volatile, thereby enabling the evaporation of this constituent to be controlled.

11. A method according to claim 10, further comprising the step of:
decreasing the partial pressure of said gas comprising said constituent that is volatile during the fourth step.

12. A method for the controlled growth of crystal whiskers, comprising:
depositing a dielectric layer on a GaAs substrate;
forming at least one aperture in said dielectric layer;
heating said substrate to evaporate As from the substrate and forming localized droplets of Ga in the said apertures;
growing GaAs whiskers in said apertures by absorption of a gas by said Ga droplets.

13. The method as recited in claim 12, further comprising:
providing a corrosive gas which corrodes at least one of the elements of said droplet, thereby reducing in size the droplets.

14. A method for controlled growth of a tapered crystal whisker, comprising the following steps:
a first step of forming on a substrate a first layer of a first material on which neither growth nor nucleation of a second material occurs;
a second step of forming at least one aperture in said first layer;
a third step of selectively depositing, in said at least one aperture, a first quantity of a third material which in liquid form is capable of dissolving and absorbing said second material, wherein said third material has a high solubility in said second material;
a fourth step of heating said third material to liquid form and growing in vapor phase in said at least one aperture, said second material to be grown in the form of said tapered crystal whisker, wherein said third material is incorporated in said second material during growth thereby continuously reducing the quantity of liquid third material available for absorbing and depositing said second material, thereby continuously decreasing a diameter of a growth surface of said whisker during growth resulting in a tapered pointed whisker.

15. A process according to claim 14, wherein said solubility of said third material in said second material during said fourth step is greater than $10^{19}$ atoms per cubic centimeter.

16. A process according to claim 14, wherein said substrate comprises silicon.

17. A process according to claim 14, wherein said second material comprises silicon and said third material comprises at least one element selected form the group consisting of Sb, As, Ga and Al.

18. A method for forming a plurality of insulated microtip cathode electrodes for a field-effect transistor, comprising the steps of:
(a) forming, on a substrate, a first layer of a first material on which neither growth nor nucleation of a material to be grown occurs;
(b) forming a plurality of apertures in said first layer;
(c) selectively depositing, in each of said plurality of apertures, a second material which, in liquid form, is capable of dissolving and absorbing said material to be grown;
(d) heating and growing in vapor phase, in each of said plurality of apertures, said material to be grown in the form of said plurality of insulated microtip cathode electrodes; and (e) decreasing a temperature of the growing microtip cathode electrodes during step (d) in such a way as to achieve a decrease of an upper width of each of the microtip cathode electrodes relative to a lower width of each of the microtip cathode electrodes in order to thereby form a plurality of insulated microtip cathode electrodes in the final field-effect transistor structure.

19. A method for forming a plurality of insulated microtip cathode electrodes of a field-effect transistor, comprising the steps of:

(a) forming, on a substrate, a first layer of a first material on which neither growth nor nucleation of a material to be grown occurs;
(b) forming a plurality of apertures in said first layer;
(c) selectively forming, in each of said plurality of apertures, a third material which, in liquid form, is capable of dissolving and absorbing said material to be grown;
(d) heating said third material and growing in vapor phase, in each of said plurality of apertures, said second material so as to form said plurality of insulated microtip cathode electrodes, wherein said third material comprises a constituent that is volatile at a temperature of growth in step (d), and wherein the growth in stp (d) is achieved in the presence of a gas comprising said constituent that is volatile, thereby enabling the evaporation of said constituent to be controlled, an wherein after step (d) said microtip cathode electrodes exist in a matrix form insulated from each other by said first layer.

20. A method for forming a plurality of insulated microtip cathode electrodes of a field-effect transistor, comprising the steps of:

(a) forming, on a substrate, a first layer of a first material on which neither growth nor nucleation of a second material occurs;
(b) forming a plurality of apertures in said first layer;
(c) selectively forming, in each of said plurality of apertures, a first quantity of a third material which in liquid form is capable of dissolving and absorbing said second material, wherein said third material has a high solubility in said second material;
(d) heating said third material to liquid form and growing in vapor phase in each of said plurality of apertures, said second material to be grown so as to form said plurality of insulated microtip cathode electrodes, wherein said third material is incorporated in said second material during growth, thereby continuously reducing the quantity of liquid third material available for absorbing and depositing said second material, and continuously decreasing a diameter of a growth surface of each of said microtip cathode electrodes during growth resulting in said plurality of insulated microtip cathode electrodes in the final field-effect transistor structure.

* * * * *